(12) United States Patent
Ilic et al.

(10) Patent No.: US 7,081,598 B2
(45) Date of Patent: Jul. 25, 2006

(54) DC-DC CONVERTER WITH OVER-VOLTAGE PROTECTION CIRCUIT

(75) Inventors: Milan Ilic, Fort Collins, CO (US); Vladislav V. Shilo, Fort Collins, CO (US); Kalyan N. C. Siddabattula, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 1 day.

(21) Appl. No.: 10/925,830

(22) Filed: Aug. 24, 2004

(65) Prior Publication Data

US 2006/0054601 A1 Mar. 16, 2006

(51) Int. Cl.
*B23K 9/00* (2006.01)

(52) U.S. Cl. ............................. 219/121.59; 219/121.43

(58) Field of Classification Search ........... 219/121.11, 219/121.36, 121.47, 121.54, 121.57, 121.59, 219/121.43; 361/58; 315/111.21; 204/192.12, 204/192.14, 298.08; 156/345.44

See application file for complete search history.

(56) References Cited

U.S. PATENT DOCUMENTS

| | | | |
|---|---|---|---|
| 4,727,297 A * | 2/1988 | Wolze | 315/307 |
| 5,584,974 A | 12/1996 | Sellers | |
| 5,917,286 A * | 6/1999 | Scholl et al. | 315/111.21 |
| 6,222,321 B1 * | 4/2001 | Scholl et al. | 315/111.21 |
| 6,621,674 B1 * | 9/2003 | Zahringer et al. | 361/58 |
| 6,633,017 B1 * | 10/2003 | Drummond et al. | 219/121.57 |
| 6,943,317 B1 * | 9/2005 | Ilic et al. | 219/121.57 |

* cited by examiner

*Primary Examiner*—Tu Hoang
(74) *Attorney, Agent, or Firm*—Benjamin Hudson, Jr.; John D. Pirnot

(57) ABSTRACT

There is provided by this invention an apparatus and method of supplying to ignite a plasma wherein in the event of an arc a shunt switch is used to divert the power away from the plasma that is incorporated into an over-voltage protection circuit that controls the shunt switch to act as a boost switch when the arc is extinguished such that the stored inductor energy is used to boost the ignition voltage for reigniting the plasma if it is extinguished. When the arc is extinguished, the inductor current is diminished, and the plasma is ignited, then the switch S1 is turned OFF and the inductor energy goes to the plasma and the power supply operates in its normal operating mode.

5 Claims, 4 Drawing Sheets

FIGURE 1 --Prior Art--

DC-DC CONVERTER WITH OVER-VOLTAGE PROTECTION CIRCUIT

BACKGROUND OF THE INVENTION

1. Field of the Invention

This invention relates generally to power supplies utilizing dc/dc converters with over-voltage protection and more particularly to over-voltage protection for power supplies for supplying power to plasma with a shunt switch across the output of the power supply.

2. Brief Description of the Prior Art

Most DC/DC power supplies use an output filter stage to reduce the ripple on the output voltage. This filter usually consists of inductors and capacitors both of which store energy. When this power supply is used to deliver power to a dc plasma process, in the event that an arc occurs, as described in the copending patent application Ser. No. 10/884,119 filed Jul. 2, 2004 entitled "Apparatus and Method for Fast Arc Extinction with Early Shunting of Arc Current in Plasma" assigned to the assignee of the instant application and incorporated herein by reference, this energy can be delivered to the plasma arc which is detrimental to the process. To reduce energy delivered into an arc, a shunt switch is used to circulate the inductor current inside of the power supply. When the arc is extinguished, the shunt switch opens. The energy stored in the inductor when it is released to the plasma, can generate a very high output voltage with very high dv/dt that can damage the power supply or the chamber. In order to protect the power supply different over-voltage protection circuits have been used. Simpler over-voltage protection scheme designs are based on energy being dissipated on passive components such as RC snubber circuits, transient voltage suppressor circuits, or metal oxide varistors. More complicated designs transfer the energy back to the input bus.

In typical switch mode power supplies that utilize a dc—dc converter with a shunt switch SW2 such as that shown in FIG. 1, the output stage can be approximated with a two pole output filter that comprises an inductor L and capacitor C as shown. In this configuration the energy from the output capacitor C will be dumped into an arc. The goal of power supply designers is to minimize the size of the output capacitor. As a result the inductor has to be increased in order to keep the output voltage ripple low. Energy stored in the inductor can be easily controlled by shunt switch SW2. Closing the switch during an arc allows inductor current to circulate inside the power supply through SW1 in the p2 position and shunt switch SW2. If there are small losses on the switches then the inductor current will not decay appreciably during this interval. At the moment the power supply is restarted by opening the shunt switch, the inductor energy will start charging the capacitor and can make the output voltage very high. To protect the switch SW2 the over-voltage circuit 10 is required.

There have been many patents that teach over-voltage protection for dc power supplies. For applications in dc sputtering processes, see for example U.S. Pat. No. 5,584,974 issued to Jeff Sellers on Dec. 17, 1996 that discloses over-voltage detection and clamping circuit that comprises a string of zener diodes or equivalent voltage limiting devices connected to the applied voltage. This circuit absorbs the voltage excursions beyond the threshold and protects the power supply and the substrate in the plasma chamber. As a result, most of the inductor energy is dissipated across the zener diodes, and in turn limits the number of arcs per second that this power supply can operate with.

It would be desirable if there were provided a power supply utilizing a dc—dc converter with an over voltage protection for the shunt switch that is used to minimize energy delivered to an arc. and limits the voltage to the ignition voltage level when the power supply extinguishes an arc.

SUMMARY OF THE INVENTION

There is provided by this invention an over-voltage scheme on the output of a power supply for dc plasma process that uses a shunt switch to divert energy away from the plasma upon initiation of an arc. The invention prevents over-voltage that occurs normally when the shunt switch opens to release energy back into an extinguished plasma on the output of the converter by utilizing the shunt switch to operate the circuit as a boost converter with zero input voltage. The inductor stored energy is used to boost the output voltage of the plasma toward the ignition level once the arc is extinguished. Once the energy is dissipated, power supply will switch to normal operating mode.

BRIEF DESCRIPTION OF THE PREFERRED EMBODIMENT

Figure 1:
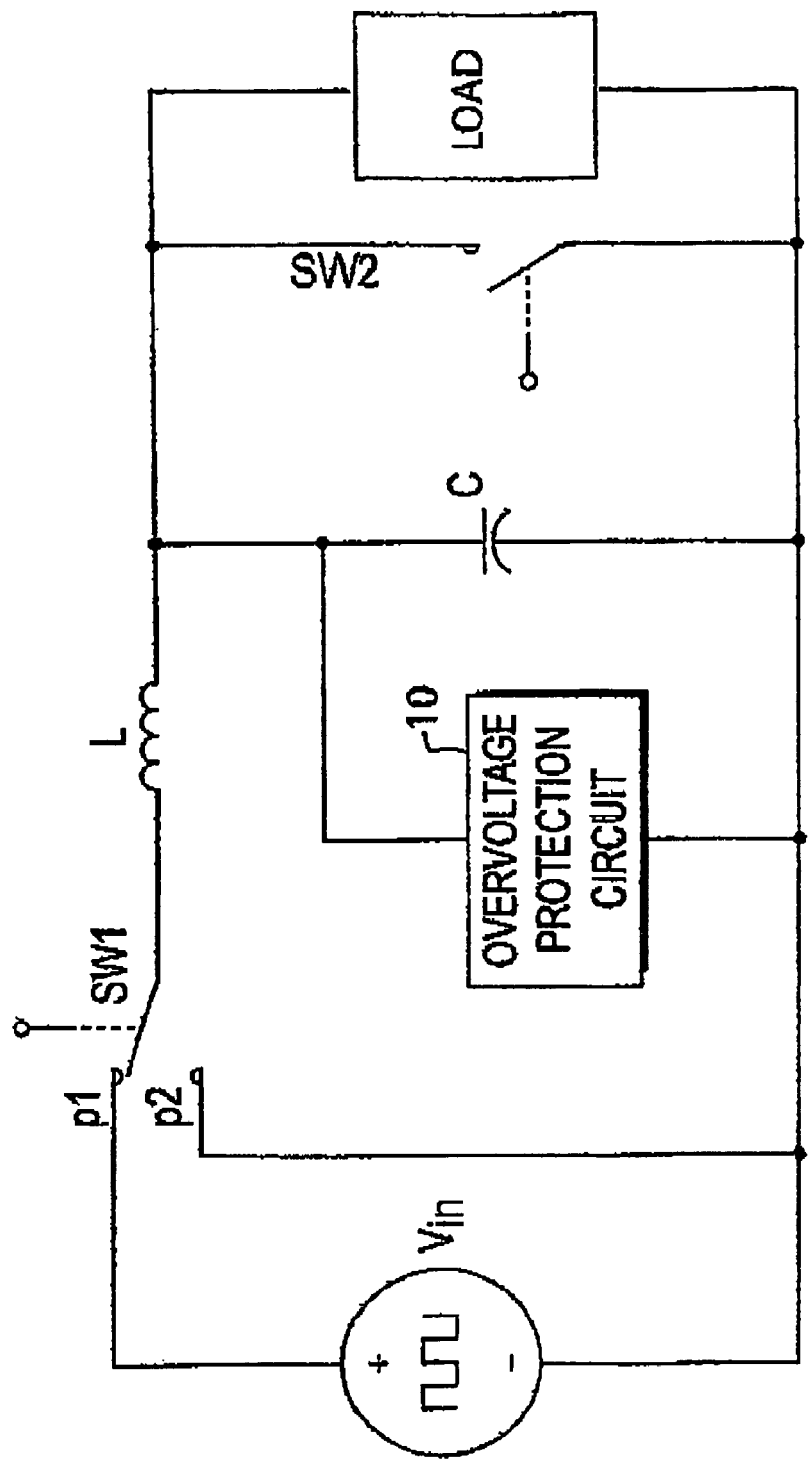
FIG. 1 illustrates a prior art output stage of a power supply utilizing a shunt switch and an over-voltage protection circuit.
Figure 2:
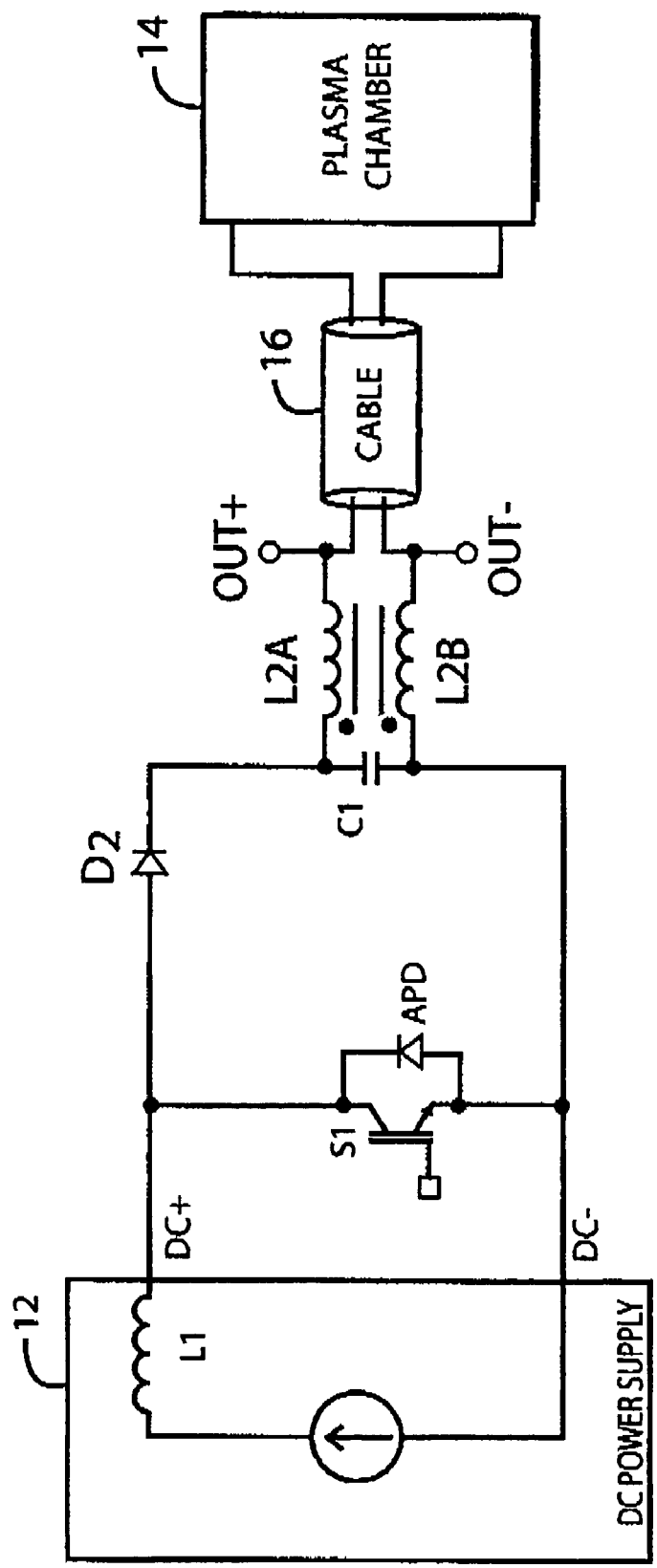
FIG. 2 illustrates an output stage of a power supply utilizing a shunt switch and an over-voltage protection circuit incorporating the principles of this invention.

Referring to FIG. 2 there is illustrated a dc power supply 12 utilizing a shunt switch S1 to divert current from the plasma chamber in accordance to the principles of this invention. Once the arc is detected by the power supply, the shunt switch S1 is turned ON. Once the switch is turned ON, the current from the power supply 12 is diverted away form the output and the plasma chamber 14. This causes the energy in the cable 16 to decay. The slope of the current depends on an output cable inductance and the losses in the power supply 12. At the end of the arc shutdown time instead of turning the switch S1 OFF, the shunt switch will be used so that the circuit now operates as a boost converter with zero input voltage. The inductor stored energy is used to boost the output voltage toward the ignition level. Depending on the energy stored in the inductor, and the characteristics of the particular vacuum chamber, the energy can be dissipated in boosting the voltage across plasma, or can be released into the plasma once ignition occurs on the plasma. Once energy is dissipated, the power supply 12 will switch to its normal operating mode.

Figure 3:
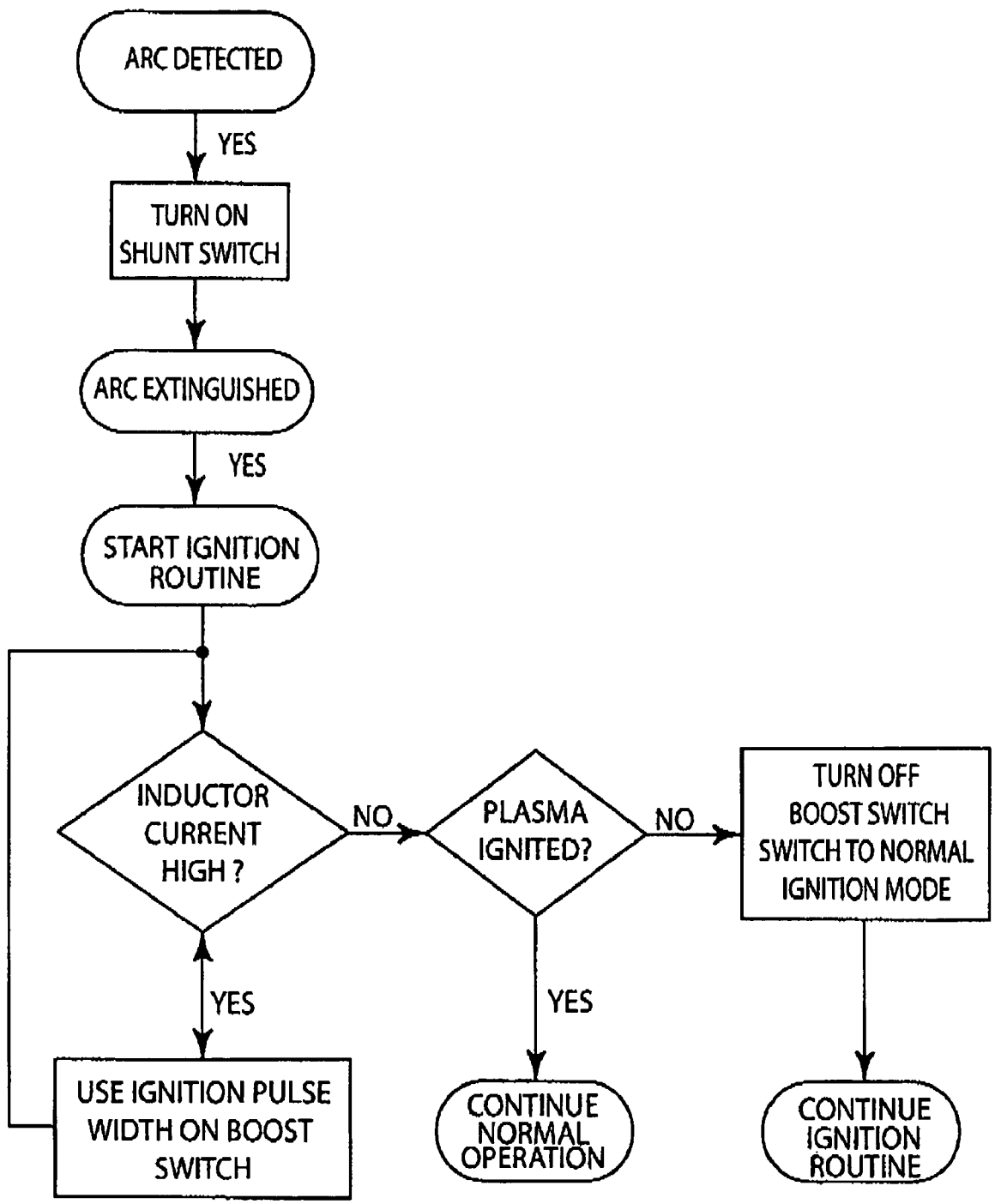
FIG. 3 illustrates a control flow chart for the output stage of the power supply shown in FIG. 2.

FIG. 3 illustrates the flow chart for the control of the over-voltage circuit. When the arc is detected the shunt switch is turned ON. When the arc is extinguished the ignition routine begins. If there is a high inductor current, then the power supply redirects the pulses for the main power supply switches (not shown) keeping them off controls the switch S1. The energy stored in the inductor is used to build the ignition voltage. If there is low inductor current after the arc is extinguished and the plasma (not shown) in the plasma chamber 14 is ignited then the shunt switch S1 is turned OFF and the power supply 12 will continue normal operation. However, if there is low inductor current after the arc is extinguished and the plasma is not ignited then the shunt switch S1 is turned OFF and the power supply controls the main power supply switches for the normal ignition mode.

Figure 4:
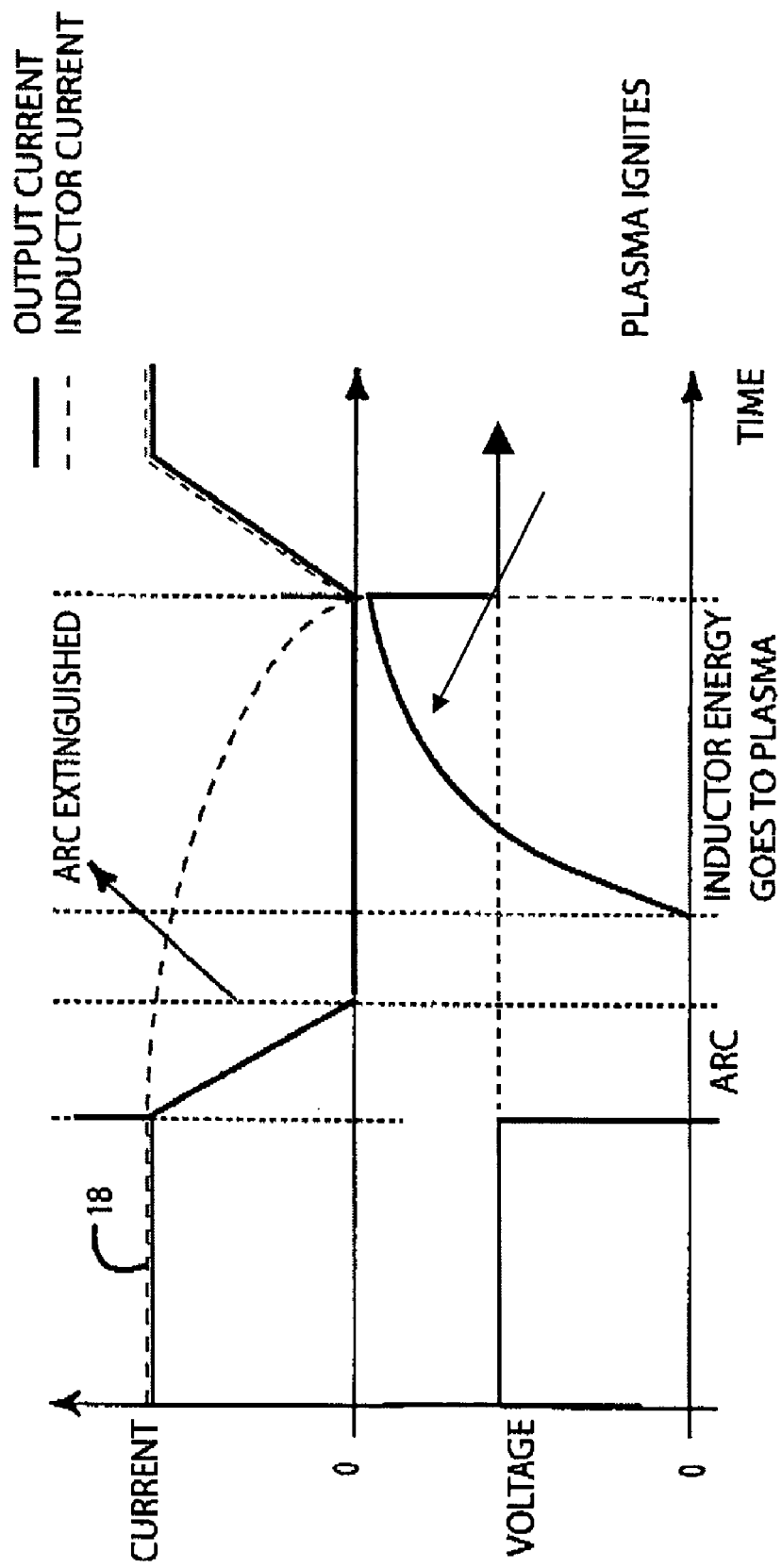
FIG. 4 illustrates the voltage and current waveforms for the output stage of the power supply shown in FIG. 2.

FIG. 4 illustrates the waveforms for the operation of the power supply control scheme shown in FIG. 3. When an arc is detected output current drops as the shunt switch S1 is turned on. Once the arc is extinguished if the plasma is not ignited and the inductor current is high, then switch S1 stays is used to operate the switch as a boost converter and the inductor current 18 is used to build the ignition voltage until it diminishes and if the plasma is not ignited then the power supply's normal ignition control scheme is used.

However, when the arc is extinguished, the inductor current is diminished, and the plasma is ignited, then the switch S1 is turned OFF and the inductor energy goes to the plasma. This control scheme may require some low power components not shown to redirect the control signals from the power supply to the shunt switch that would be well know to those skilled in the art. The over-voltage protection circuit shown and described by the foregoing description operates as a lossless circuit with no limitation for the number of arcs per second.

It can readily be seen that there is provided a unique over-voltage protection scheme that differs from the convention over-voltage protection schemes that utilize dissipative circuits wherein the inductor energy is dissipated in the over-voltage circuit. These types of circuits require significant power ratings for the over-voltage in order to handle the required number of arcs per second. Instead of dissipating energy stored in the circuit, the energy is used to build the ignition voltage for reigniting the plasma when it has been extinguished.

Although there is illustrated and described specific structure and details of operation, it is clearly understood that the same were merely for purposes of illustration and that changes and modifications may be readily made therein by those skilled in the art without departing from the spirit and the scope of this invention.

We claim:

1. Apparatus for dc plasma processing, comprising:
   a) a chamber for plasma processing having at least two electrodes contained therein;
   b) a power supply for supplying voltage to the electrodes to ignite plasma and deliver power; and
   c) a circuit that turns ON a shunt switch to divert current away from the plasma at the initiation of an arc; and
   d) an over-voltage protection circuit that controls a shunt switch to act as a boost switch when the arc is extinguished wherein the stored inductor energy is used to boost an ignition voltage for reigniting the plasma if it is extinguished.

2. Apparatus for do plasma processing as recited in claim 1 wherein control signals for main switches of the power supply are redirected to the shunt switch in the event inductor current is high and the plasma is not ignited, thereby controlling the shunt switch as a boost switch.

3. Apparatus for dc plasma processing as recited in claim 2 wherein the over-voltage protection circuit turns the shunt switch to the OFF position when the arc is extinguished, the inductor current is low, and the plasma is not ignited to allow the power supply to continue normal ignition Operation with the main switches of the power supply.

4. Apparatus for do plasma processing as recited in claim 3 wherein the over-voltage protection circuit turns the shunt switch to the OFF position when the arc is extinguished and the plasma is ignited to allow the power supply to continue normal operation.

5. A method of operating a dc plasma process consisting of the steps of:
   a) delivering voltage, current and power from a set of at least two output terminals of a power supply to electrodes in a plasma chamber to ignite and sustain plasma, the power supply having stored energy;
   b) sensing the occurrence of an arc condition in the plasma;
   c) inhibiting the flow of energy from the power supply to the plasma utilizing a shunt switch to divert energy until the arc is extinguished;
   d) eliminating over-voltage on the shunt switch that occurs when the shunt switch opens to release energy back into an extinguished plasma utilizing the stored energy to boost the ignition voltage of the power supply after the arc is extinguished and the plasma is not ignited; and
   e) redirecting any stored energy of the power supply to the plasma if ignited after the arc is extinguished reestablishing the power supply's normal operation.

* * * * *